US012798969B2

(12) United States Patent
Kim et al.

(10) Patent No.: US 12,798,969 B2
(45) Date of Patent: Nov. 17, 2026

(54) METHOD OF MANUFACTURING HEXAGONAL BORON NITRIDE MULTILAYER

(71) Applicant: Sookmyung Women's University Industry-Academic Cooperation Foundation, Seoul (KR)

(72) Inventors: Soo Min Kim, Seoul (KR); Hayoung Ko, Suwon-si (KR)

(73) Assignee: Sookmyung Women's University Industry-Academic Cooperation Foundation, Seoul (KR)

( * ) Notice: Subject to any disclaimer, the term of this patent is extended or adjusted under 35 U.S.C. 154(b) by 259 days.

(21) Appl. No.: 18/503,838

(22) Filed: Nov. 7, 2023

(65) Prior Publication Data

US 2024/0166516 A1 May 23, 2024

(30) Foreign Application Priority Data

Nov. 22, 2022 (KR) ........................ 10-2022-0157343

(51) Int. Cl.

| | |
|---|---|
| ***C23C 16/34*** | (2006.01) |
| ***C01B 21/064*** | (2006.01) |
| ***C23C 16/00*** | (2006.01) |
| ***C23C 16/46*** | (2006.01) |

(52) U.S. Cl.

CPC ........ *C01B 21/0646* (2013.01); *C23C 16/003* (2013.01); *C23C 16/342* (2013.01); *C23C 16/46* (2013.01); *C01P 2002/76* (2013.01); *C01P 2002/82* (2013.01); *C01P 2004/04* (2013.01)

(58) Field of Classification Search

CPC ...... C23C 16/342; C23C 16/46; C23C 16/003

See application file for complete search history.

(56) References Cited

U.S. PATENT DOCUMENTS

| | | | | |
|---|---|---|---|---|
| 4,545,968 | A | 10/1985 | Hirano et al. | |
| 11,679,978 | B2 | 6/2023 | Shi et al. | |
| 2015/0086460 | A1* | 3/2015 | Kim | C23C 18/143 427/532 |
| 2016/0281221 | A1* | 9/2016 | Kim | C25B 1/02 |

(Continued)

FOREIGN PATENT DOCUMENTS

| | | | | |
|---|---|---|---|---|
| CN | 107815664 A * | 3/2018 | | C23C 16/34 |
| CN | 110921637 A | 3/2020 | | |

(Continued)

OTHER PUBLICATIONS

Gao, Menglei, et al., "Catalyst-free growth of two-dimensional hexagonal boron nitride few-layers on sapphire for deep ultraviolet photodetectors". Journal of Materials Chemistry C, 2019, 7, 14999--15006.*

(Continued)

*Primary Examiner* — Bret P Chen

(74) *Attorney, Agent, or Firm* — HARNESS, DICKEY & PIERCE, P.L.C.

(57) ABSTRACT

A method of manufacturing a hexagonal boron nitride multilayer according to an embodiment of the inventive concept, which includes providing a catalyst substrate including iron into a tube, using a heater to raise an internal temperature of the tube to 1400° C. or higher, and providing a boron nitride precursor into the tube to form a hexagonal boron nitride multilayer on the catalyst substrate.

15 Claims, 26 Drawing Sheets

(56) References Cited

U.S. PATENT DOCUMENTS

| | | | |
|---|---|---|---|
| 2018/0105426 | A1 | 4/2018 | Sung |
| 2019/0345603 | A1 | 11/2019 | Ago et al. |

FOREIGN PATENT DOCUMENTS

| | | | | | |
|---|---|---|---|---|---|
| CN | 112188992 A | * | 1/2021 | | C01B 21/064 |
| GB | 2192643 | * | 1/1988 | | C23C 16/34 |
| GB | 2573812 | * | 11/2019 | | C23C 16/34 |
| JP | H11-97434 A | | 4/1999 | | |
| JP | 2004210562 | * | 7/2004 | | C01B 31/36 |
| JP | 5613970 B2 | | 10/2014 | | |
| JP | 2021-526120 A | | 9/2021 | | |
| KR | 10-2013-0032536 | * | 4/2013 | | C01B 31/02 |
| KR | 10-1480617 | * | 1/2015 | | C01B 21/064 |
| KR | 101692514 B1 | | 1/2017 | | |
| KR | 10-2020-0040169 A | | 4/2020 | | |
| KR | 10-2020-0046910 | * | 5/2020 | | C30B 29/38 |
| WO | WO 2019/220142 | * | 11/2019 | | C01B 21/064 |
| WO | WO-2020057672 A1 | * | 3/2020 | | C01B 21/064 |

OTHER PUBLICATIONS

English abstract for KR 10-2020-0046910. 1 page.*

Juma, Isaac G., et al., "Direct growth of hexagonal boron nitride on non-metallic substrates and its heterostructures with graphene". iScience 24, 103374, Nov. 19, 2021, pp. 1-19.*

Maestre, Camille, et al., "Hexagonal boron nitride: a review on selfstanding crystals synthesis towards 2D nanosheets". Journal of Physics: Materials, 4 (2021) 044018, pp. 1-15.*

Kim, Soo Min et al. "Synthesis of large-area multilayer hexagonal boron nitride for high material performance." Nature Communications (2015).

GuangyuanLu et al., Synthesisoflargesingle-crystalhexagonalboron nitridegrainsonCu—Nialloy, Nat. Comm. 6, 6160 (2015).

Guangyuan Lu et al., Synthesis of High-Quality Graphene and Hexagonal Boron Nitride Monolayer In-Plane Heterostructure on Cu—Ni Alloy, Adv. Sci. 2017, 1700076.

NilanjanBasu et al., LargeAreaFew-LayerHexagonalBoronNitrideasaRaman Enhancement Material, Nanomaterials 11, 622 (2021).

U.Chandni, et al., EvidenceforDefect-MediatedTunnelinginHexagonalBoronNitride-BasedJunctions, Nano Lett. 15, 11, 7329-7333 (2015).

Roman V. Gorbachev et al., Hunting for Monolayer Boron Nitride: Optical and Raman Signatures, Small 7, 4, 456-468 (2011).

* cited by examiner

METHOD OF MANUFACTURING HEXAGONAL BORON NITRIDE MULTILAYER

CROSS-REFERENCE TO RELATED APPLICATIONS

This U.S. non-provisional patent application claims priority under 35 U.S.C. § 119 of Korean Patent Application No. 10-2022-0157343, filed on Nov. 22, 2022, the entire contents of which are hereby incorporated by reference.

BACKGROUND

The present disclosure herein relates to a method of manufacturing a hexagonal boron nitride multilayer, and more particularly, to a method of manufacturing a hexagonal boron nitride multilayer, using a catalyst substrate including iron.

Hexagonal boron nitride generally has a hexagonal layered structure similar to that of graphite. The hexagonal boron nitride is excellent in properties such as heat dissipation, high electrical insulating properties, high lubricity, corrosion resistance, release properties, high temperature stability, and chemical stability.

As a method of manufacturing a hexagonal boron nitride multilayer, there are known methods such as: a method involving directly nitriding boron by use of nitrogen or ammonia; a method involving making boron halide react with ammonia or an ammonium salt; and a method involving making a boron compound such as boron oxide react with a nitrogen-containing organic compound for reduction-nitridation.

SUMMARY

The present disclosure provides a method of manufacturing a hexagonal boron nitride multilayer having excellent crystallinity, uniformity, and coverage, using chemical vapor deposition.

An embodiment of the inventive concept provides a method of manufacturing a hexagonal boron nitride multilayer, which includes providing a catalyst substrate including iron into a tube, using a heater to raise an internal temperature of the tube to 1400° C. or higher, and providing a boron nitride precursor into the tube to form a hexagonal boron nitride multilayer on the catalyst substrate.

In an embodiment of the inventive concept, there is provided a method of manufacturing a hexagonal boron nitride multilayer, which includes providing a catalyst substrate including iron in a tube, using a heater to raise an internal temperature of the tube to 1400° C. or higher, providing a boron nitride precursor into the tube to melt the catalyst substrate; and lowering the internal temperature of the tube to solidify the molten catalyst substrate.

In an embodiment of the inventive concept, there is provided a method of driving a deposition apparatus, which includes providing a catalyst substrate including iron into a tube, using a heater to raise an internal temperature of the tube to 1400° C. or higher, and providing a boron nitride precursor into the tube, wherein the tube includes aluminum oxide.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Hereinafter, a stack structure and a manufacturing method thereof according to embodiments of the inventive concept will be described in detail with reference to the drawings.

Figure 1:
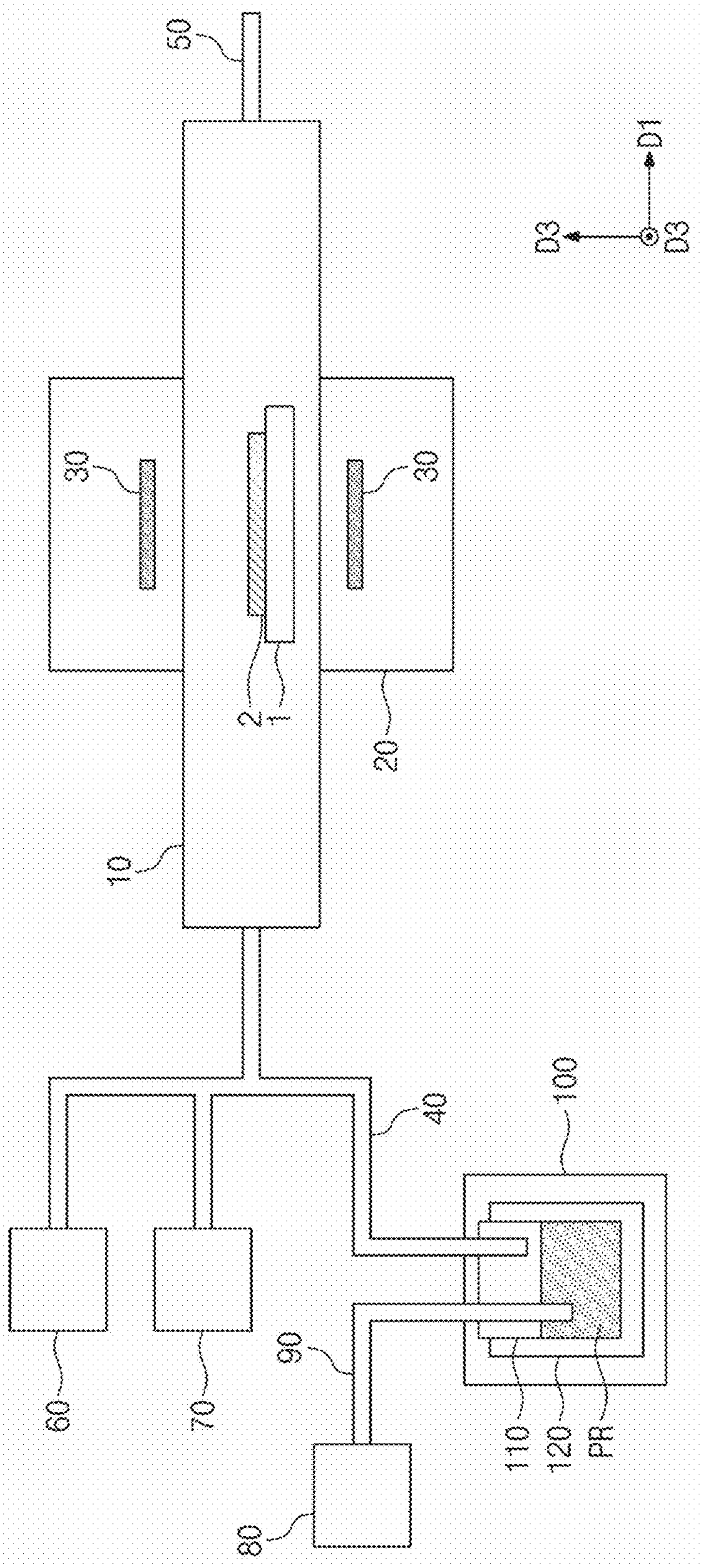
FIG. 1 is a view for describing a deposition apparatus according to some embodiments.

FIG. 1 is a view for describing a deposition apparatus according to some embodiments.

Referring to FIG. 1, a deposition apparatus may include a tube 10, a furnace 20, heaters 30, a connection pipe 40, an exhaust pipe 50, a first gas supply device 60, and a second gas supply device 70, a third gas supply device 80, a gas supply pipe 90, and a bubbler system 100.

The tube 10 may include an empty space therein. The empty space inside the tube 10 may be sealed. A hexagonal boron nitride (hBN) multilayer may be formed in the empty space inside the tube 10. The tube 10 may extend in a first direction D1. The tube 10 may include a material capable of withstanding a process temperature of 1400° C. or higher. For example, the tube 10 may include aluminum oxide ($Al_2O_3$).

The furnace 20 may surround tube 10. The tube 10 may pass through the furnace 20 in the first direction D1. In some embodiments, the furnace 20 may include thermal insulation.

The heaters 30 may be provided into the furnace 20. The heaters 30 may be disposed adjacent to the tube 10. According to operation of the heaters 30, an internal temperature of the tube 10 may rise. The heaters 30 may include a material capable of raising the internal temperature of the tube 10 to 1400° C. or higher. For example, the heaters 30 may include silicon carbide (SiC) or molybdenum silicide ($MoSi_2$). In some embodiments, the heaters 30 may have a cylindrical shape extending in the first direction D1 and may be disposed above or below the tube 10.

The connection pipe 40 may connect the first gas supply device 60, the second gas supply device 70, the bubbler system 100, and the tube 10.

The exhaust pipe 50 may be connected to the tube 10. Materials remaining in the tube 10 after a deposition process may be exhausted to the outside through the exhaust pipe 50.

The first gas supply device 60 and the second gas supply device 70 may supply gas into the tube 10. For example, the first gas supply device 60 may supply argon gas into the tube 10, and the second gas supply device 70 may supply hydrogen gas into the tube 10.

The bubbler system 100 may include a container 110 and a chiller system 120. A liquid boron nitride precursor PR may be provided into the container 110. The boron nitride precursor PR may be, for example, borazine ($B_3H_6N_3$). The container 110 may be provided into the chiller system 120. The chiller system 120 may include an anti-freeze solution, and regulate temperature of the anti-freeze solution to control temperature of the boron nitride precursor PR in the container 110. For example, the boron nitride precursor PR may be stored at a temperature below zero in the container 110 according to operation of the chiller system 120.

The gas supply pipe 90 may connect the third gas supply device 80 and the bubbler system 100. The gas supply pipe 90 may be connected to the boron nitride precursor PR in the container 110. The third gas supply device 80 may supply gas to the boron nitride precursor PR through the gas supply pipe 90. For example, the third gas supply device 80 may supply hydrogen gas to the boron nitride precursor PR. The boron nitride precursor PR may be supplied to the tube 10 through the connection pipe 40 by the gas supplied from the third gas supply device 80.

Figure 2:
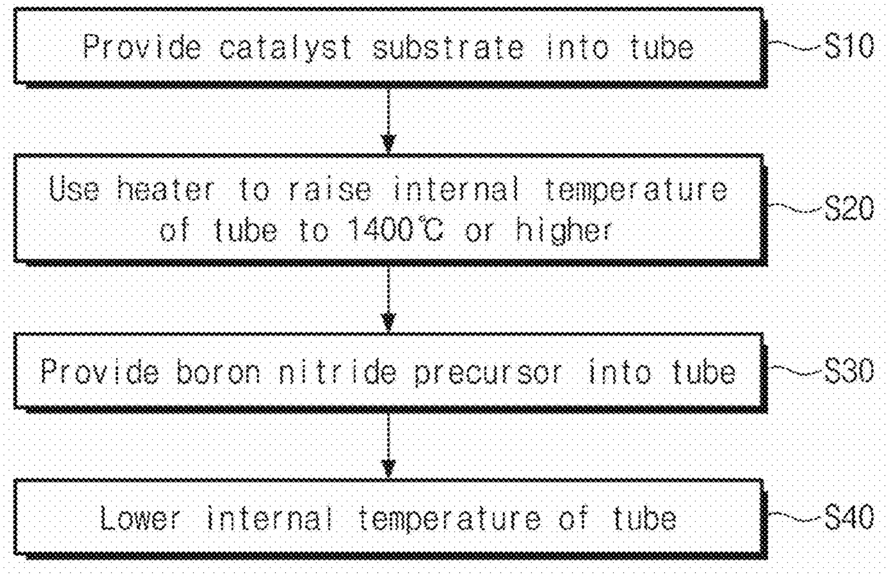
FIG. 2 is a flowchart for describing a method of manufacturing a hexagonal boron nitride multilayer according to some embodiments.
Figure 3:
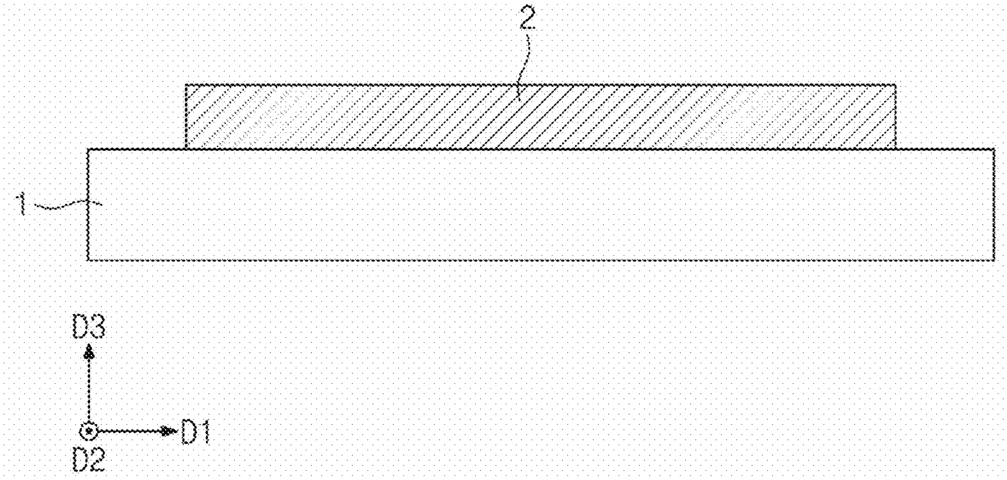
FIGS. 3, 4, and 5 are cross-sectional views for describing a method of manufacturing a hexagonal boron nitride multilayer according to FIG. 2.
Figure 4:
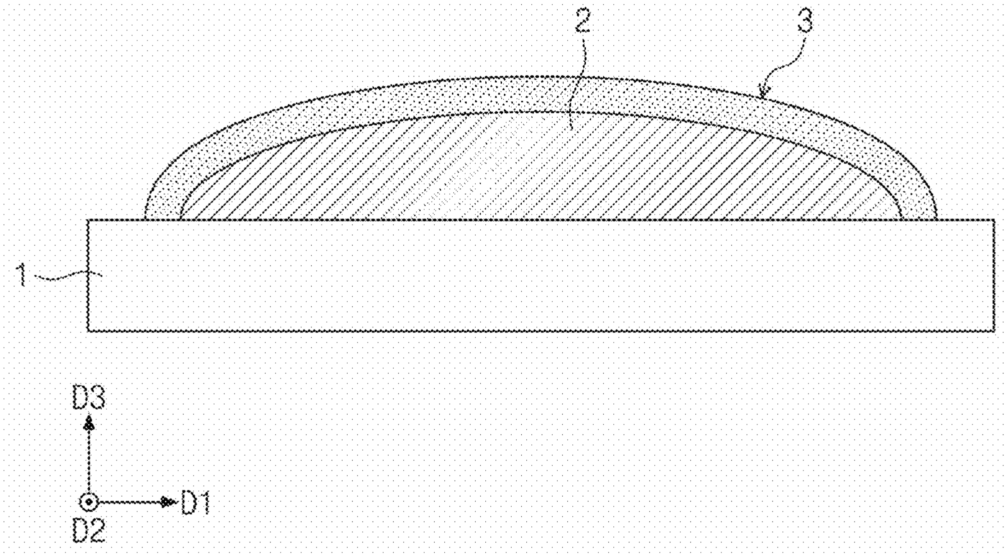
Figure 5:
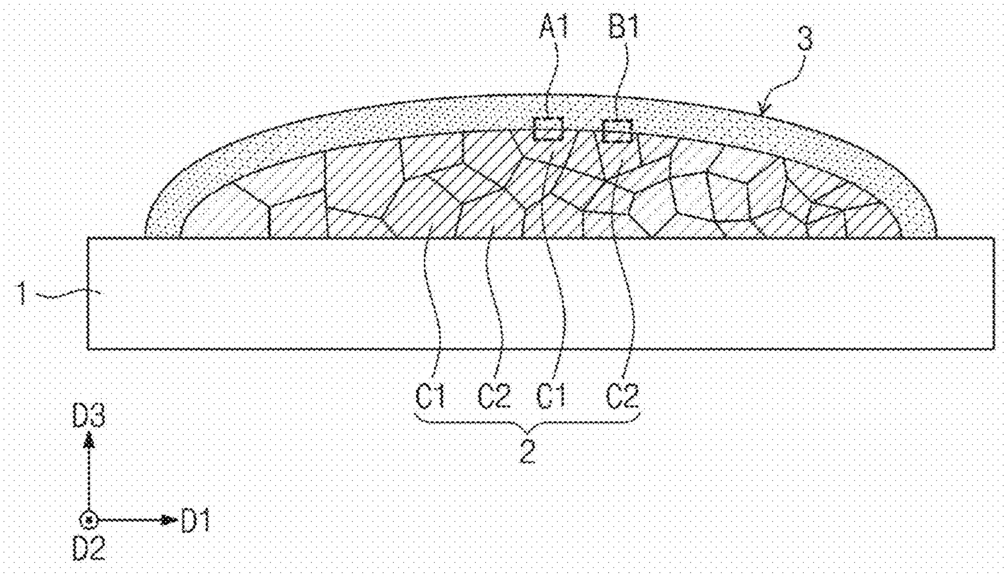
Figure 6A:
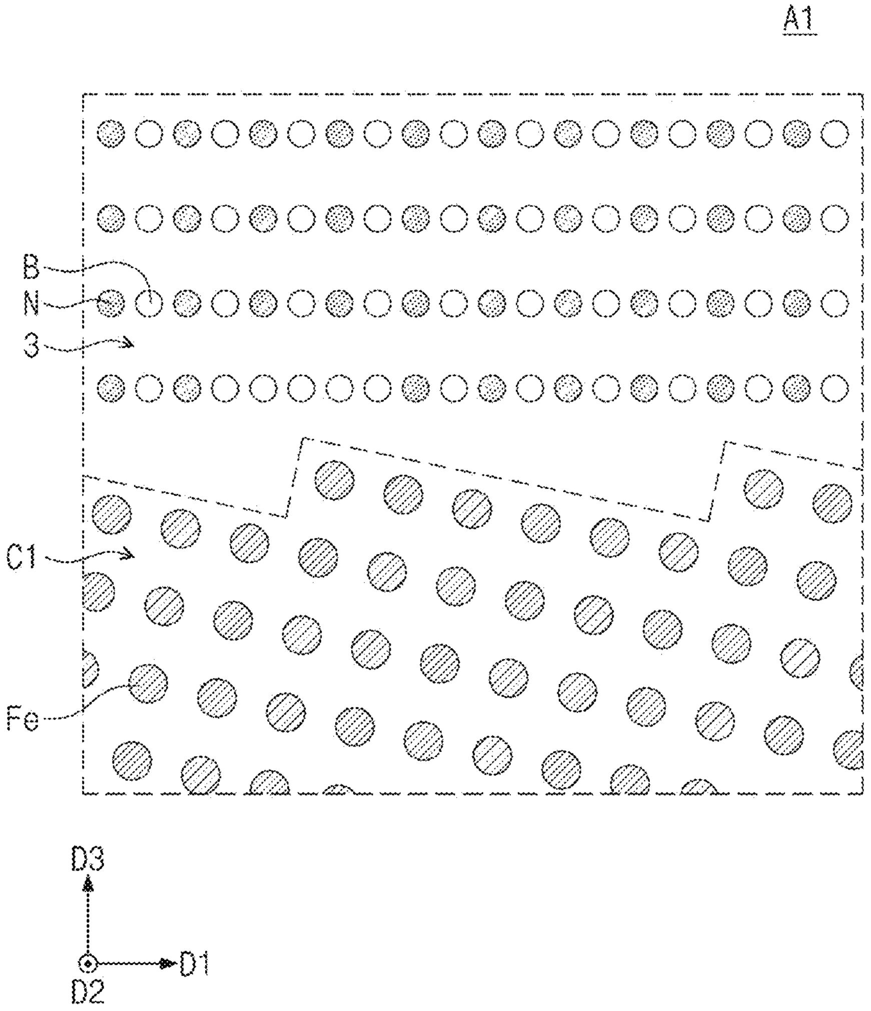
FIG. 6A is an enlarged view of region A of FIG. 5.
Figure 6B:
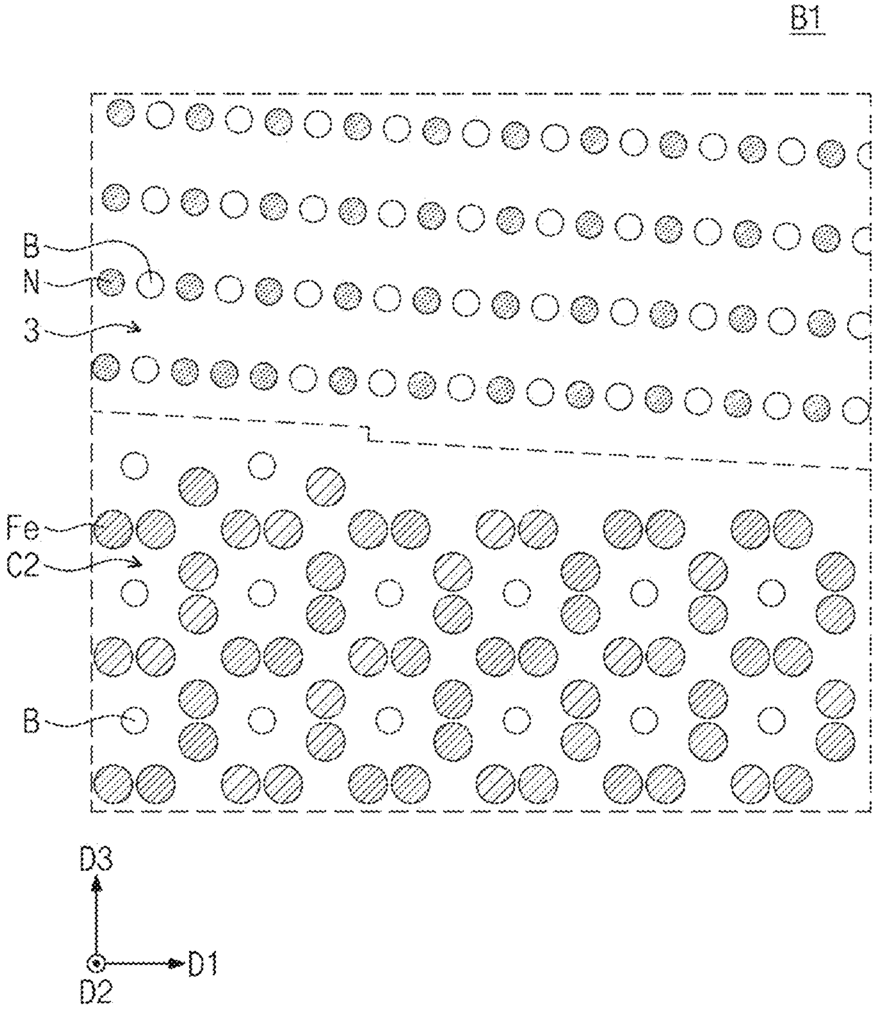
FIG. 6B is an enlarged view of region B of FIG. 5.

FIG. 2 is a flowchart for describing a method of manufacturing a hexagonal boron nitride multilayer according to some embodiments. FIGS. 3, 4, and 5 are cross-sectional views for describing a method of manufacturing a hexagonal boron nitride multilayer according to FIG. 2. FIG. 6A is an enlarged view of region A of FIG. 5. FIG. 6B is an enlarged view of region B of FIG. 5.

Referring to FIG. 2, a method of manufacturing a hexagonal boron nitride multilayer may include providing a catalyst substrate into a tube (S10), using a heater to raise an internal temperature of the tube to 1400° C. or higher (S20), and providing a boron nitride precursor into the tube (S30), and lowering the internal temperature of the tube (S40). The hexagonal boron nitride multilayer may be manufactured using chemical vapor deposition.

FIGS. 1, 2, and 3, a support plate 1 and a catalyst substrate 2 may be provided into the tube 10 (S10). The support plate 1 may include a material capable of withstanding a process temperature of 1400° C. or higher. For example, the support plate 1 may include aluminum oxide ($Al_2O_3$). The catalyst substrate 2 may include iron (Fe). The catalyst substrate 2 may be a single crystal catalyst substrate or a polycrystalline catalyst substrate.

Referring to FIGS. 1, 2, and 4, using the heaters 30, an internal temperature of the tube 10 may be raised to 1400° C. or higher (S20).

A boron nitride precursor may be provided into the tube 10 (S30). For example, borazine ($B_3H_6N_3$) may be provided into the tube 10. As the boron nitride precursor is provided at the raised internal temperature inside the tube 10, the boron nitride precursor may react with the catalyst substrate 2. In some embodiments, the boron nitride precursor may be decomposed into nitrogen, boron, hydrogen, and boron nitride, and the decomposed nitrogen, boron, and boron nitride may react with the catalyst substrate 2.

The boron nitride precursor reacts with the catalyst substrate 2, and boron may thus be dissolved in the catalyst substrate 2. As boron is dissolved in the catalyst substrate 2, a melting point of the catalyst substrate 2 may be lowered, and the catalyst substrate 2 may be melted. The molten catalyst substrate 2 may include iron and boron.

In some embodiments, the catalytic substrate 2 may be entirely melted. That is, the catalyst substrate 2 may be completely melted. A supply amount of the boron nitride precursor may be controlled such that the catalyst substrate 2 is completely melted, using the third gas supply device 80 and the bubbler system 100. As the supply amount of the boron nitride precursor is greater, melting of the catalyst substrate 2 may be facilitated. Time for the high-temperature process may be controlled such that the catalyst substrate 2 is completely melted, using the heaters 30.

In some embodiments, a portion close to a surface of the catalyst substrate 2 may be melted, and a portion far from a surface of the catalyst substrate 2 may not be melted. That is, the catalyst substrate 2 may be partially melted. A supply amount of the boron nitride precursor may be controlled such that the catalyst substrate 2 is partially melted, using the third gas supply device 80 and the bubbler system 100. Time for the high-temperature process may be controlled such that the catalyst substrate 2 is partially melted, using the heaters 30.

In some embodiments, the internal temperature of the tube 10 may be raised to 1500° C. or less, considering melting points of the tube 10, the heaters 30, and the support plate 1.

The boron nitride precursor may react with the catalyst substrate 2 to form a hexagonal boron nitride multilayer 3. The hexagonal boron nitride multilayer 3 may include a plurality of hexagonal boron nitride films.

As the hexagonal boron nitride multilayer 3 is formed in a state in which the surface of the catalyst substrate 2 is melted at a high temperature of 1400° C. or higher, a size of crystals included in the hexagonal boron nitride multilayer 3 may be relatively large to improve crystallinity of the hexagonal boron nitride multilayer 3. As the hexagonal boron nitride multilayer 3 is formed in a state in which the surface of the catalyst substrate 2 is melted at a high temperature of 1400° C. or higher, impurities included in the hexagonal boron nitride multilayer 3 may be minimized, and a thickness of the hexagonal boron nitride multilayer 3 may be formed uniformly, thereby improving uniformity of the hexagonal boron nitride multilayer 3. As the hexagonal boron nitride multilayer 3 is formed in a state in which the surface of the catalyst substrate 2 is melted at a high temperature of 1400° C. or higher, the hexagonal boron nitride multilayer 3 may be formed to completely cover the surface of the catalyst substrate 2, thereby improving uniformity of the hexagonal boron nitride multilayer 3.

Referring to FIGS. 1, 2, 5, 6A, and 6B, the internal temperature of the tube 10 may be lowered (S40). As the internal temperature of the tube 10 is lower, the molten catalyst substrate 2 may be solidified. The solidified catalyst substrate 2 may include first crystals C1 and second crystals C2. The first crystals C1 may be Fe crystals including iron atoms (Fe). The second crystals C2 may be Fe2B crystals including iron atoms (Fe) and boron atoms (B).

A hexagonal boron nitride film including boron atoms (B) and nitrogen atoms (N), which are bonded to each other on the first crystals C1 and the second crystals C2 of the catalyst substrate 2 may be stacked in a multilayer structure. In some embodiments, the thickness of the hexagonal boron nitride multilayer 3 may be greater by providing a boron nitride precursor into the tube 10 while lowering the internal temperature of the tube 10.

As the process is performed at a high temperature of 1400° C. or higher, boron may be dissolved in the catalyst substrate 2, and the solidified catalyst substrate 2 may include $Fe_2B$ crystals as the temperature is lower.

FIGS. 7A, 7B, 7C, 7D, 7E, 7F, 7G, and 7H are views for describing characteristics of a hexagonal boron nitride multilayer according to process temperature. FIGS. 7A to 7H show results of forming a hexagonal boron nitride multilayer in a deposition apparatus of FIG. 1.

Figure 7A:
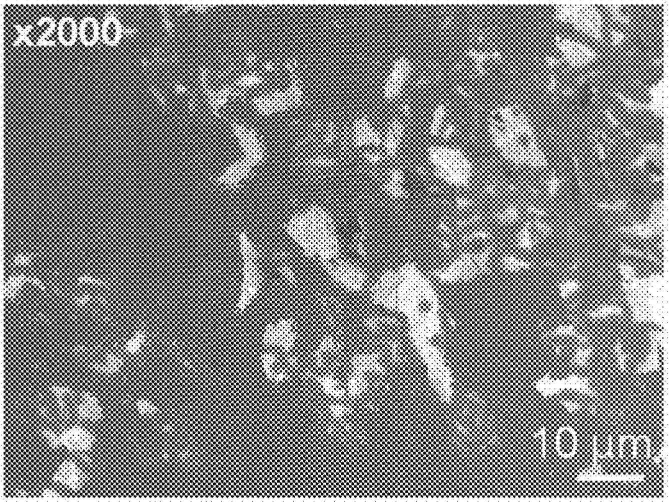
FIGS. 7A, 7B, 7C, 7D, 7E, 7F, 7G, and 7H are views for describing characteristics of a hexagonal boron nitride multilayer according to process temperature.
Figure 7B:
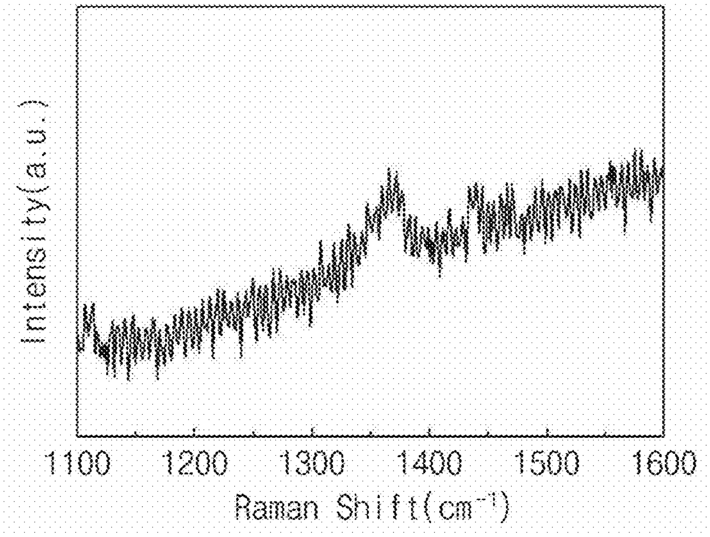

Referring to FIGS. 7A and 7B, a hexagonal boron nitride multilayer was formed at a temperature of 1100° C., and scanning electron microscope (SEM) images and Raman spectrum were observed. It was confirmed that the hexagonal boron nitride multilayer formed at a temperature of 1100° C. contained oxide (arrow) as an impurity, and that the Raman spectrum peak was unclear.

Figure 7C:
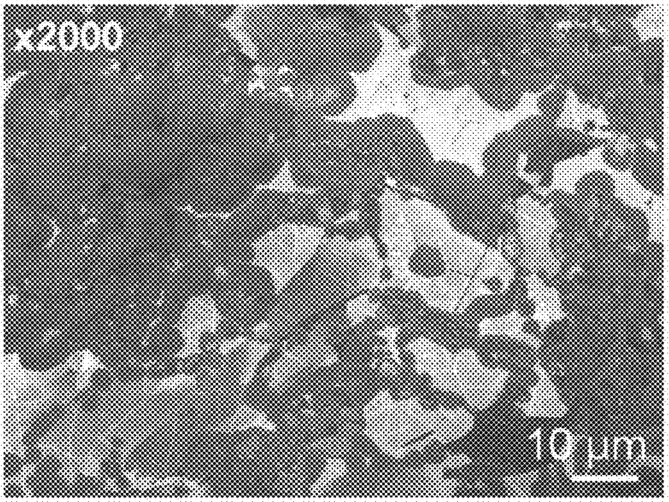
Figure 7D:
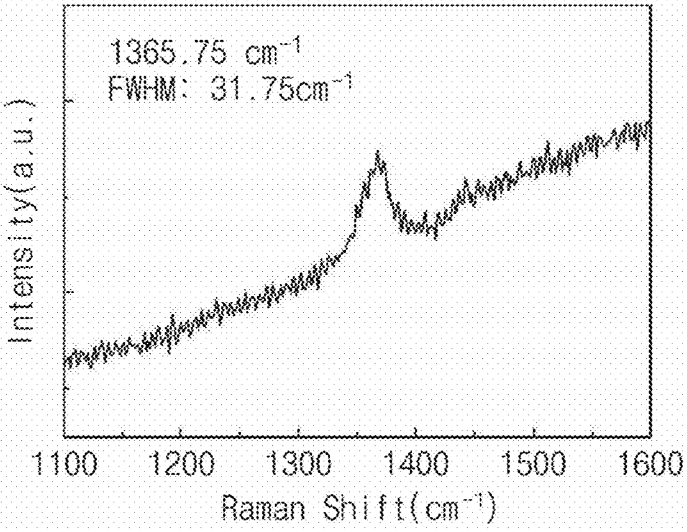

Referring to FIGS. 7C and 7D, a hexagonal boron nitride multilayer was formed at a temperature of 1200° C., and SEM images and Raman spectrum were observed. It was confirmed that the hexagonal boron nitride multilayer formed at a temperature of 1200° C. contained oxide (arrow) as an impurity, and had a full width at half maximum (FWHM) of Raman spectrum of 31.75 $cm^{-1}$.

Figure 7E:
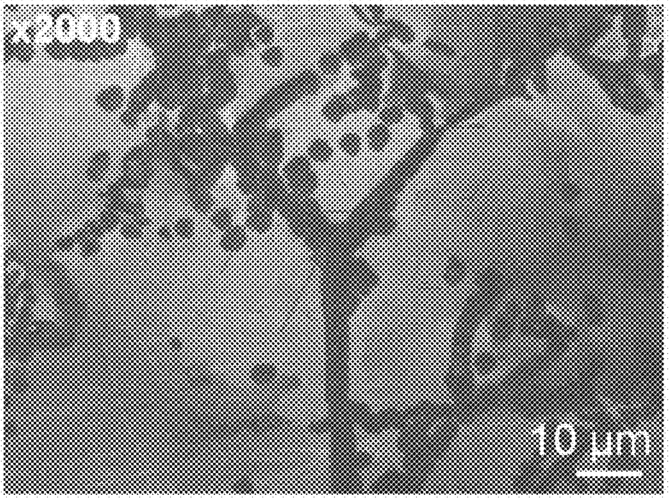
Figure 7F:
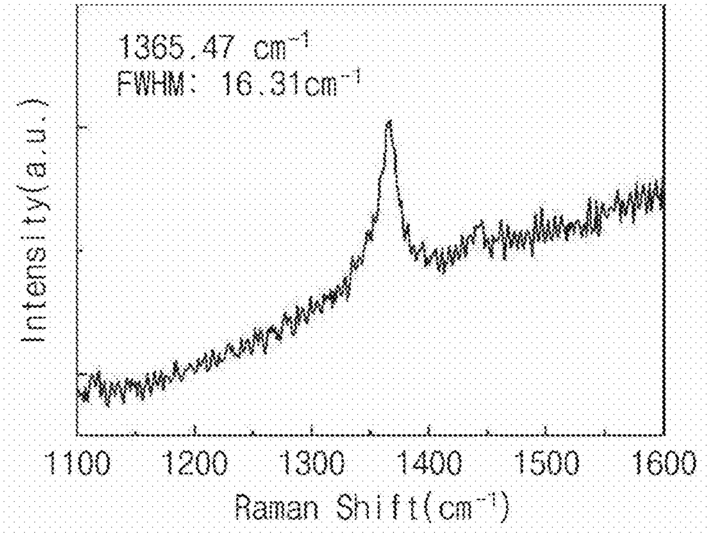

Referring to FIGS. 7E and 7F, a hexagonal boron nitride multilayer was formed at a temperature of 1300° C., and SEM images and Raman spectrum were observed. It was confirmed that the hexagonal boron nitride multilayer formed at a temperature of 1300° C. contained oxide (arrow) as an impurity, and had a full width at half maximum (FWHM) of Raman spectrum of 16.31 $cm^{-1}$.

Referring to FIGS. 7A to 7F, when a hexagonal boron nitride multilayer was formed at a temperature of 1100° C., 1200° C., and 1300° C., a surface of a catalyst substrate was not completely dissolved due to low solubility of boron with respect to the catalyst substrate. Accordingly, it was confirmed that oxygen included in the tube or the support plate reacted with iron of the catalyst substrate on the undissolved surface of the catalyst substrate to form an oxide.

Figure 7G:
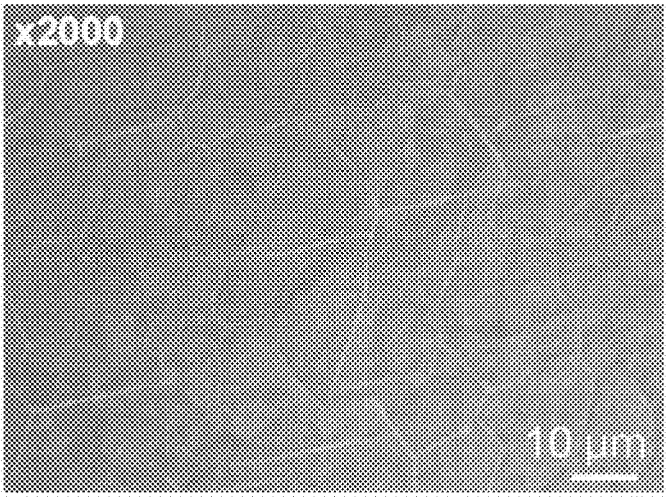
Figure 7H:
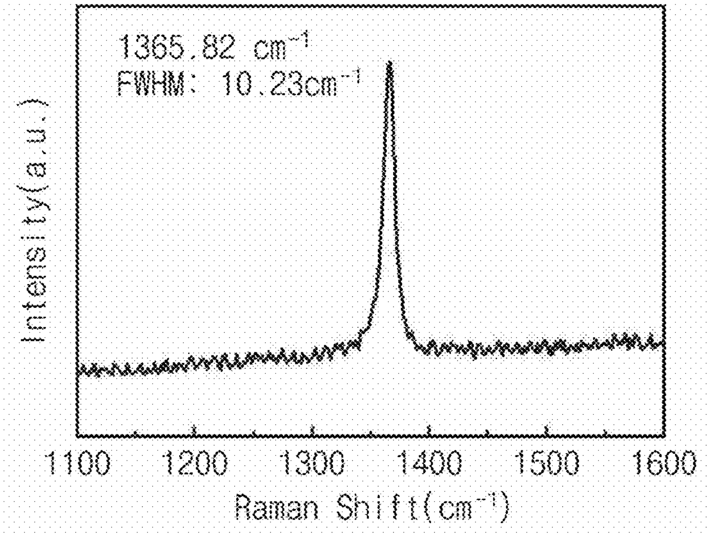

Referring to FIGS. 7G and 7H, a hexagonal boron nitride multilayer was formed at a temperature of 1400° C., and SEM images and Raman spectrum were observed. It was confirmed that the hexagonal boron nitride multilayer formed at a temperature of 1400° C. did not contain oxide as an impurity. Accordingly, it was confirmed that the hexagonal boron nitride multilayer had excellent uniformity at a temperature of 1400° C. It was confirmed that the hexagonal boron nitride multilayer formed at a temperature of 1400° C. had a full width at half maximum (FWHM) of Raman spectrum of 10.23 $cm^{-1}$. Accordingly, it was confirmed that crystal size of the hexagonal boron nitride multilayer was large and crystallinity was excellent at a temperature of 1400° C.

Figure 8A:
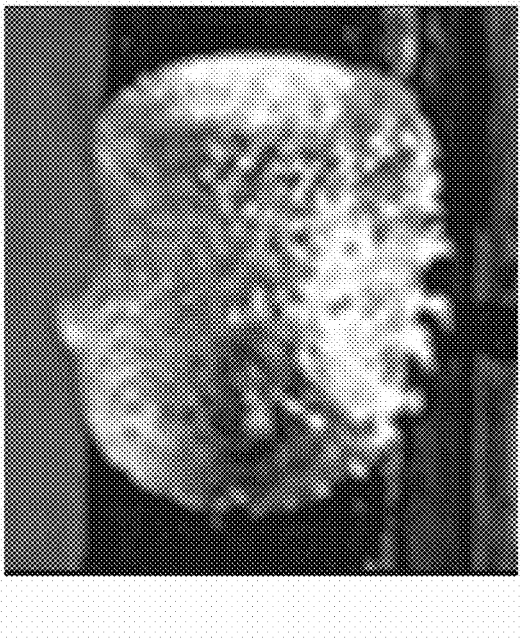
FIGS. 8A, 8B, 8C, and 8D are views for describing characteristics of a catalyst substrate and a hexagonal boron nitride multilayer according to partial melting of the catalyst substrate.
Figure 8B:
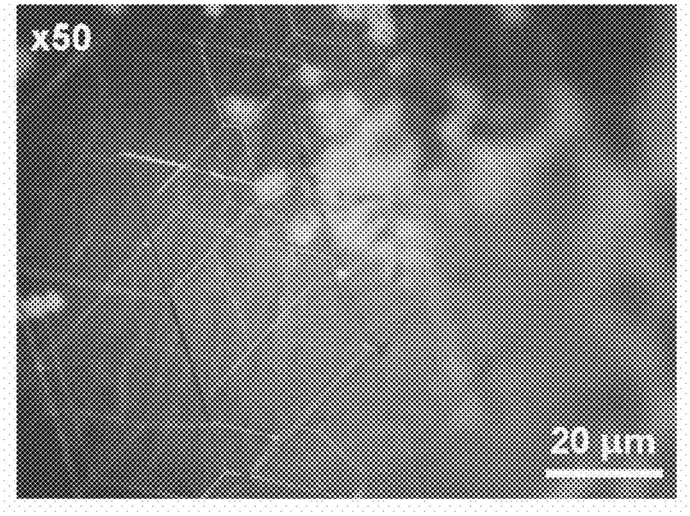
Figure 8C:
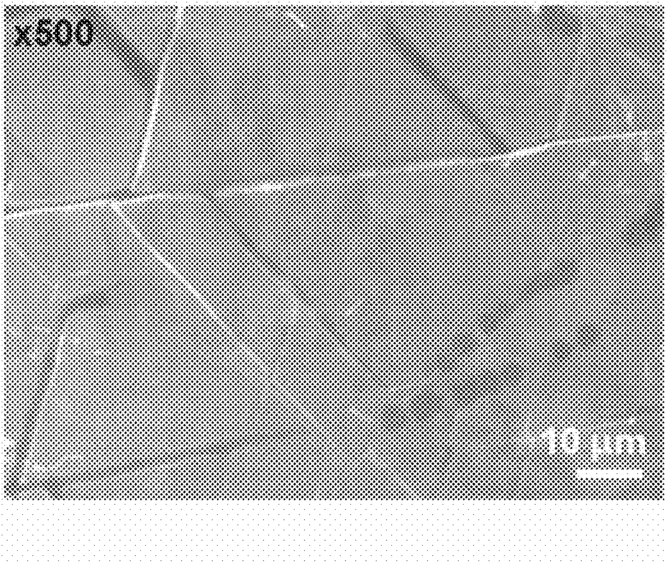
Figure 8D:
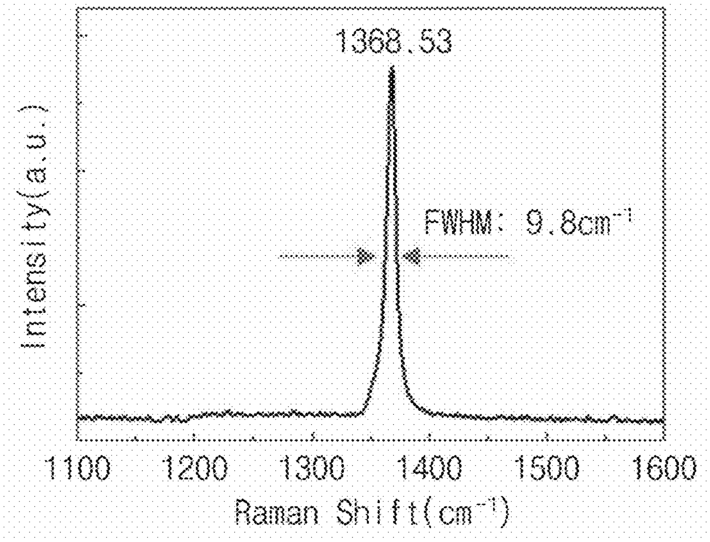

FIGS. 8A, 8B, 8C, and 8D are views for describing characteristics of a catalyst substrate and a hexagonal boron nitride multilayer according to partial melting of the catalyst substrate. FIGS. 8A to 8D show results obtained by performing a method of manufacturing a hexagonal boron nitride multilayer according to FIG. 2 in the deposition apparatus according to FIG. 1. FIG. 8A is an image showing shape of a solidified catalyst substrate, FIG. 8B is an optical microscope image of a hexagonal boron nitride multilayer, FIG. 8C is an SEM image of a hexagonal boron nitride multilayer, and FIG. 8D is Raman spectrum of a hexagonal boron nitride multilayer.

Referring to FIG. 8A, when a catalyst substrate is partially melted in the process of melting the catalyst substrate, it was confirmed that the solidified catalyst substrate had a shape close to a plane. Accordingly, a hexagonal boron nitride multilayer on the catalyst substrate may have a shape close to a plane, and the hexagonal boron nitride multilayer may provide greater utilization.

Referring to FIGS. 8B, 8C, and 8D, it was confirmed that the hexagonal boron nitride multilayer formed when the catalyst substrate was partially melted had relatively high uniformity.

Figure 9A:
FIGS. 9A, 9B, 9C, and 9D are views for describing characteristics of a catalyst substrate and a hexagonal boron nitride multilayer according to complete melting of the catalyst substrate.
Figure 9B:
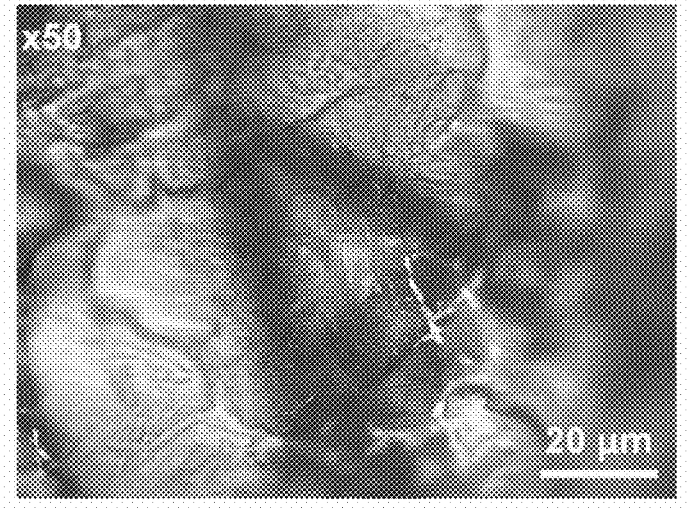
Figure 9C:
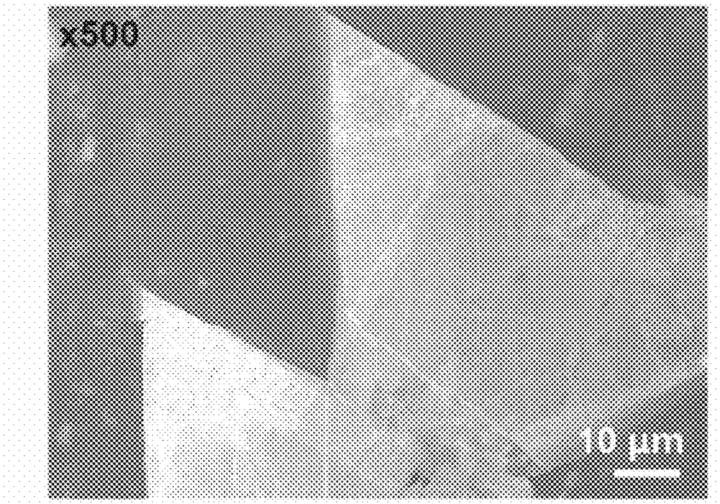
Figure 9D:
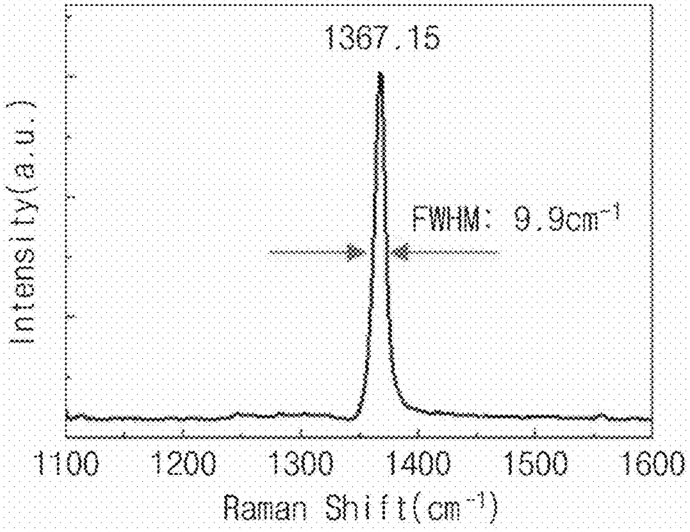

FIGS. 9A, 9B, 9C, and 9D are views for describing characteristics of a catalyst substrate and a hexagonal boron nitride multilayer according to complete melting of the catalyst substrate. FIGS. 9A to 9D show results obtained by performing a method of manufacturing a hexagonal boron nitride multilayer according to FIG. 2 in the deposition apparatus according to FIG. 1. FIG. 9A is an image showing shape of a solidified catalyst substrate, FIG. 9B is an optical microscope image of a hexagonal boron nitride multilayer, FIG. 9C is an SEM image of a hexagonal boron nitride multilayer, and FIG. 9D is Raman spectrum of a hexagonal boron nitride multilayer.

Referring to FIG. 9A, it was confirmed that the solidified catalyst substrate had a shape similar to a sphere when the catalyst substrate was completely melted in the process of melting the catalyst substrate. Accordingly, the hexagonal boron nitride multilayer on the catalyst substrate may have a shape similar to a sphere.

Referring to FIGS. 9B, 9C, and 9D, it was confirmed that the hexagonal boron nitride multilayer formed when the catalyst substrate was completely melted had relatively high crystallinity.

Figure 10A:
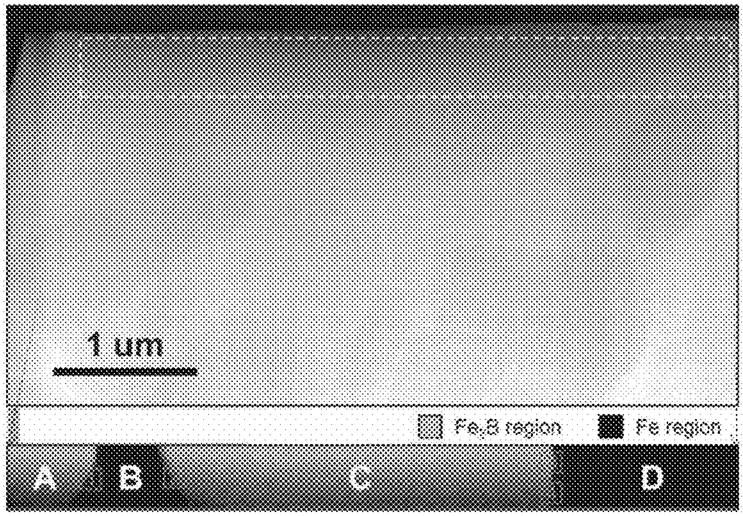
FIGS. 10A, 10B, 10C, 10D, and 10E are views for describing a crystal structure of a solidified catalyst substrate.
Figure 10B:
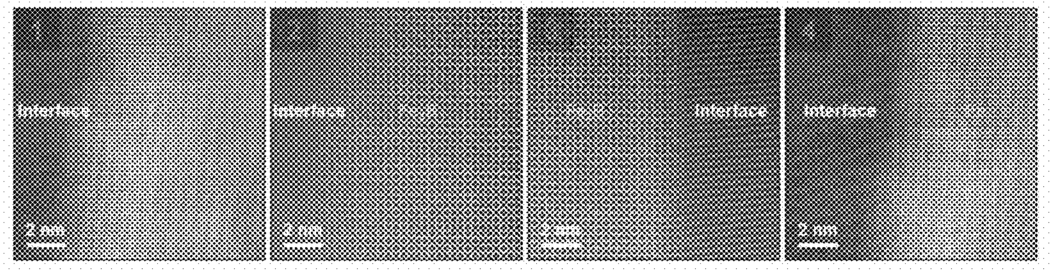
Figure 10C:
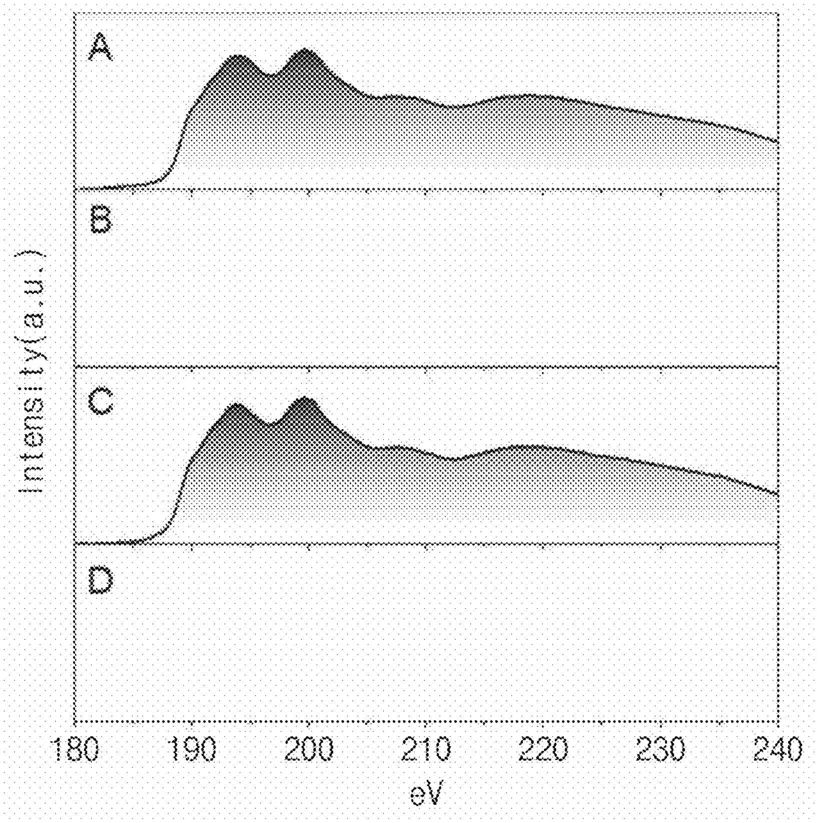
Figure 10D:
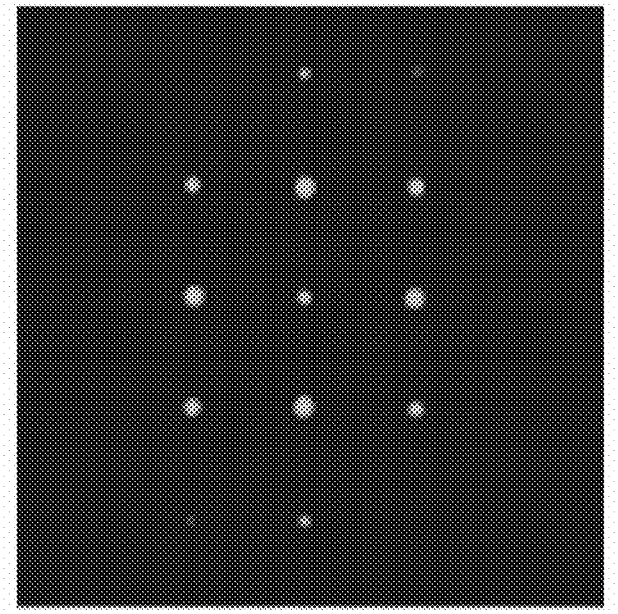
Figure 10E:
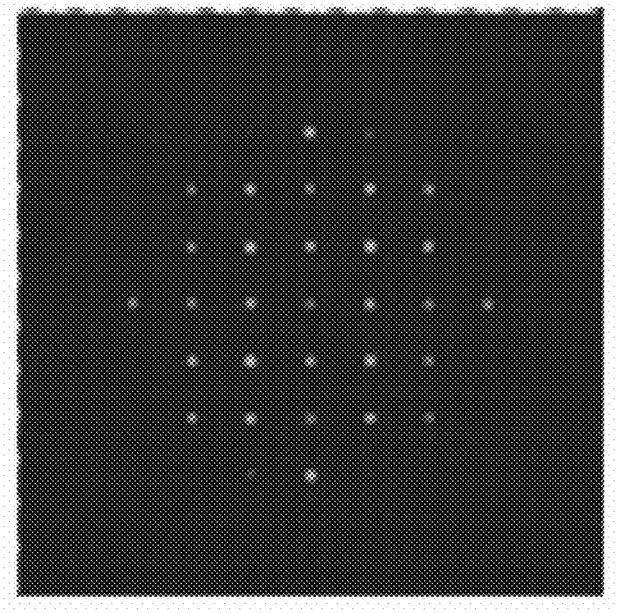

FIGS. 10A, 10B, 10C, 10D, and 10E are views for describing a crystal structure of a solidified catalyst substrate. FIGS. 10A to 10E show results obtained by performing a method of manufacturing a hexagonal boron nitride multilayer according to FIG. 2 in the deposition apparatus according to FIG. 1. FIG. 10A is a low-magnification cross-sectional scanning transmission electron microscope (STEM) image of a solidified catalyst substrate, FIG. 10B is an image enlarging (1), (2), (3), and (4) of FIG. 10A, FIG. 10C shows B-K edges of regions A, B, C, and D of FIG. 10A, FIG. 10D is an electron diffraction image of region B of FIG. 10A, and FIG. 10E is an electron diffraction image of region A of FIG. 10A.

Referring to FIGS. 10A, 10B, 10C, 10D, and 10E, it was confirmed that $Fe_2B$ crystals were formed in regions A and C of the solidified catalyst substrate, and Fe crystals were formed in regions B and D of the solidified catalyst substrate.

Figure 11A:
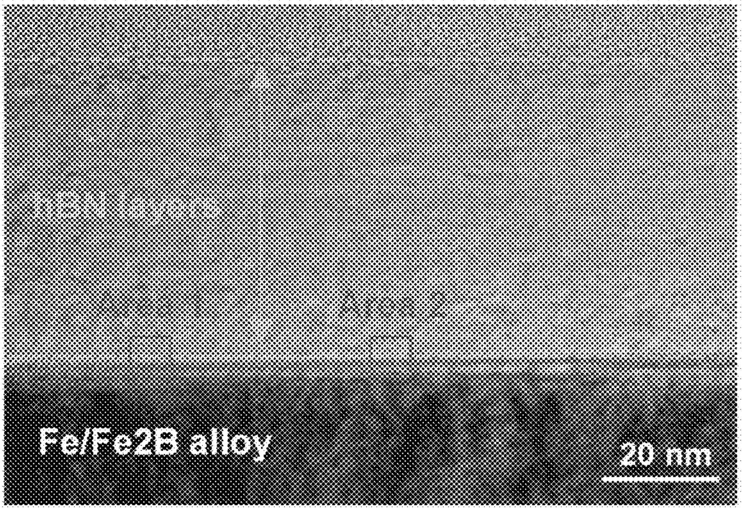
FIGS. 11A, 11B, and 11C are images showing structures of a catalyst substrate and a hexagonal boron nitride multilayer.
Figure 11B:
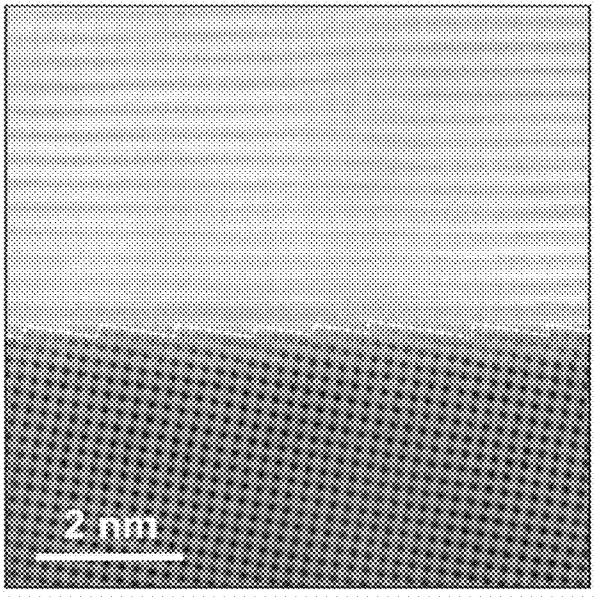
Figure 11C:
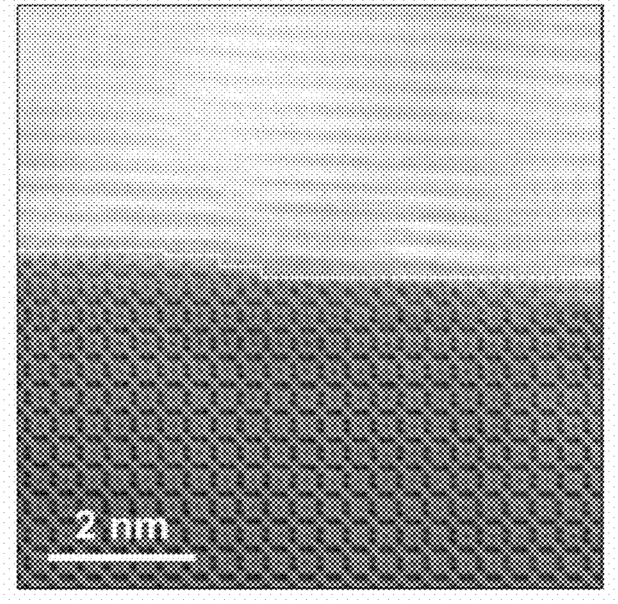

FIGS. 11A, 11B, and 11C are images showing structures of a catalyst substrate and a hexagonal boron nitride multilayer. FIGS. 11A to 11C show results obtained by performing a method of manufacturing a hexagonal boron nitride multilayer according to FIG. 2 in the deposition apparatus according to FIG. 1. FIG. 11A is a STEM image showing a catalyst substrate and a hexagonal boron nitride multilayer, FIG. 11B is an image enlarging region 1 of FIG. 11A, and FIG. 11C is an image enlarging region 2 of FIG. 11A.

Referring to FIGS. 11A, 11B, and 11C, it was confirmed that a hexagonal boron nitride multilayer including a plurality of hexagonal boron nitride films was uniformly formed on a catalyst substrate including $Fe_2B$ crystals and Fe crystals.

Figure 12A:
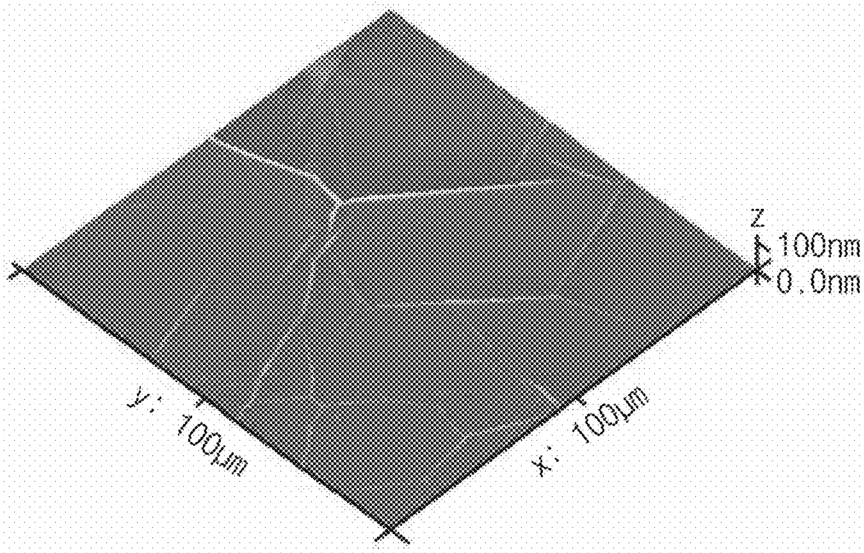
FIGS. 12A and 12B are atomic force microscopy (AFM) images of a hexagonal boron nitride multilayer.
Figure 12B:
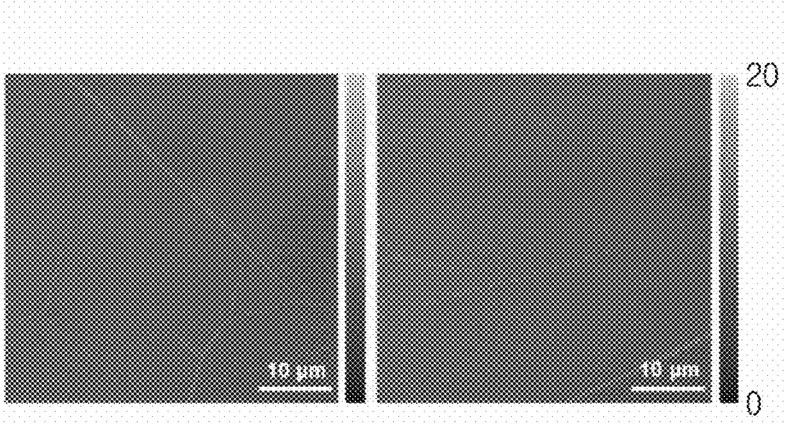

FIGS. 12A and 12B are atomic force microscopy (AFM) images of a hexagonal boron nitride multilayer. FIGS. 12A and 12B show results obtained by performing a method of manufacturing a hexagonal boron nitride multilayer according to FIG. 2 in the deposition apparatus according to FIG. 1.

Referring to FIGS. 12A and 12B, it was confirmed that the hexagonal boron nitride multilayer had a roughness (rms) of 0.15 nm or less, except for a portion where wrinkles were formed. In addition, it was confirmed that the hexagonal boron nitride multilayer had excellent uniformity and coverage.

Figure 13A:
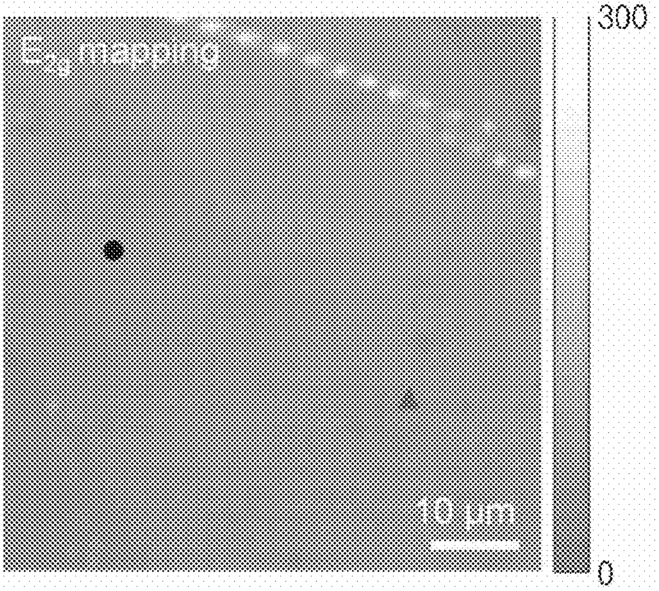
FIGS. 13A, 13B, and 13C are views for describing uniformity of a hexagonal boron nitride multilayer.
Figure 13B:
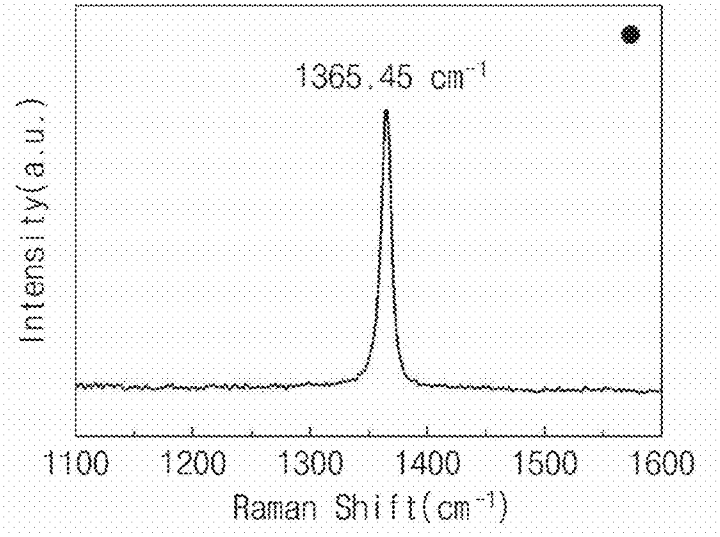
Figure 13C:
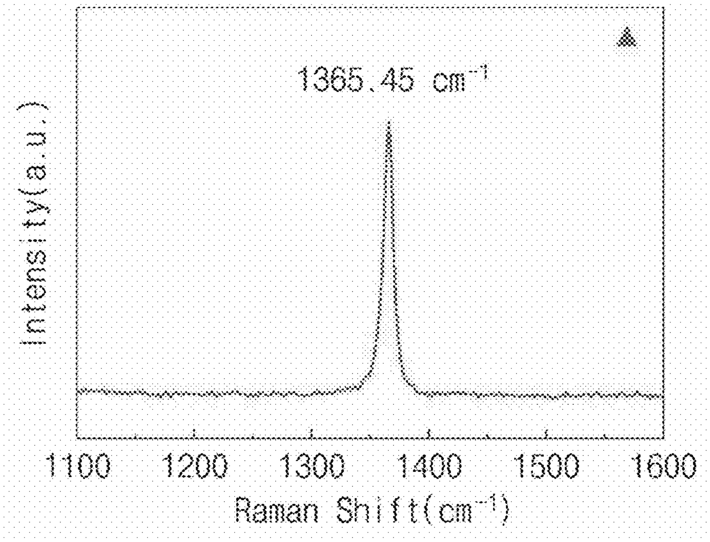

FIGS. 13A, 13B, and 13C are views for describing uniformity of a hexagonal boron nitride multilayer. FIGS. 13A to 13C show results obtained by performing a method of manufacturing a hexagonal boron nitride multilayer according to FIG. 2 in the deposition apparatus according to FIG. 1. FIG. 13A is a Raman peak mapping image of a hexagonal boron nitride multilayer, and FIGS. 13B and 13C are Raman spectra of two positions in FIG. 13A.

Referring to FIGS. 13A, 13B, and 13C, it was confirmed that peak intensities and full widths at half maximum were similar at the two positions, and the hexagonal boron nitride multilayer had excellent uniformity.

Figure 14A:
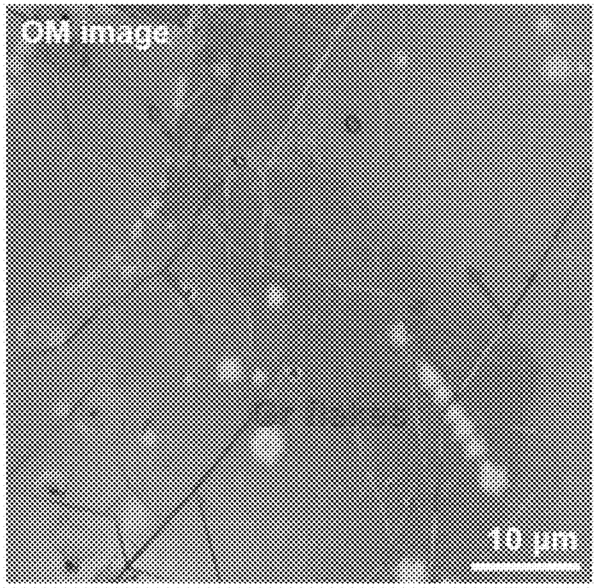
FIGS. 14A, 14B, 14C, and 14D are views for describing characteristics of graphene formed on a hexagonal boron nitride multilayer.
Figure 14B:
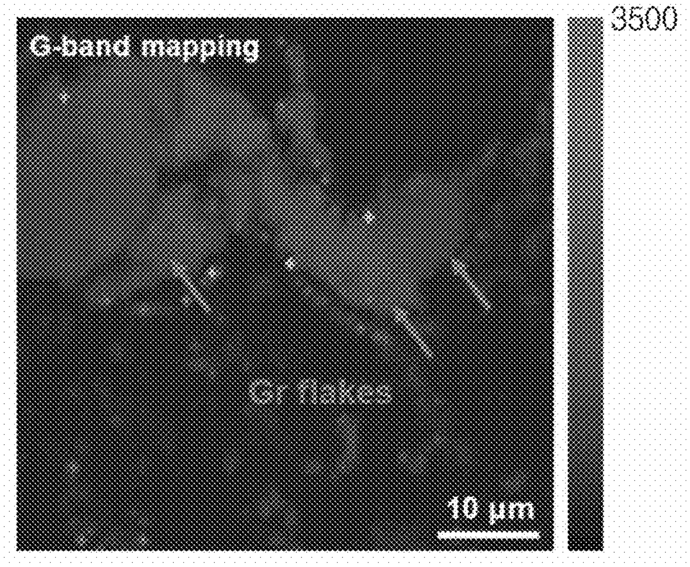
Figure 14C:
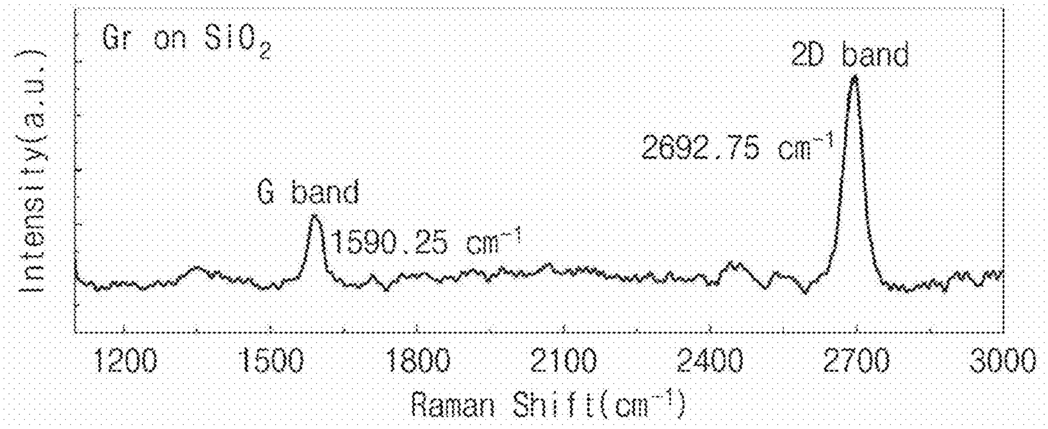
Figure 14D:
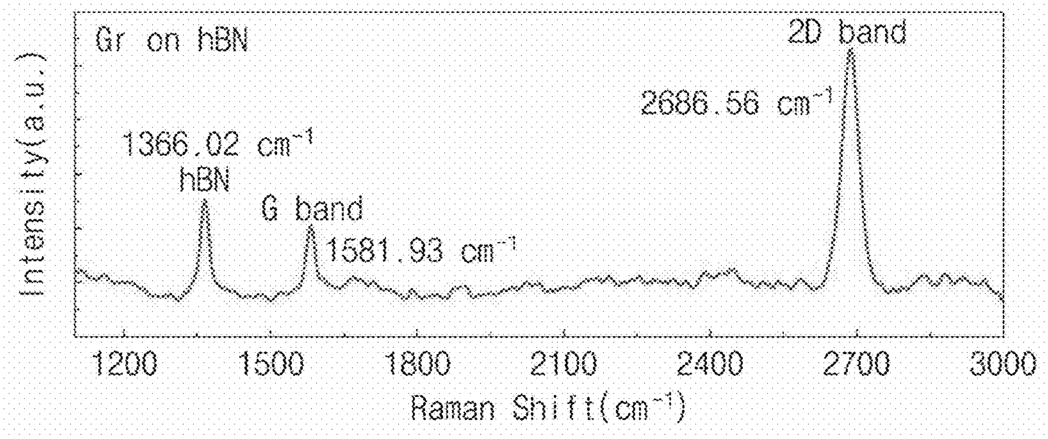

FIGS. 14A, 14B, 14C, and 14D are views for describing characteristics of graphene formed on a hexagonal boron nitride multilayer. FIGS. 14A to 14C show results of performing the method of manufacturing a hexagonal boron nitride multilayer according to FIG. 2 in the deposition apparatus of FIG. 1, growing graphene on copper foil, and then transferring the graphene onto a hexagonal boron nitride multilayer. FIG. 14D shows results of growing graphene on copper foil and then transferring graphene onto a $SiO_2$ substrate. FIG. 14A is an optical microscope image of a hexagonal boron nitride multilayer and graphene, FIG. 14B is a G band and 2D band Raman peak mapping image of graphene, and FIG. 14C is Raman spectrum of a hexagonal boron nitride multilayer and graphene, and FIG. 14D is Raman spectrum of graphene on a $SiO_2$ substrate.

Referring to FIGS. 14A and 14B, it was confirmed that graphene flakes were formed on a hexagonal boron nitride multilayer.

Referring to FIGS. 14C and 14D, it was confirmed that the G band and 2D band peaks of graphene formed on the hexagonal boron nitride multilayer were not doped and were intrinsic, compared to graphene formed on the $SiO_2$ substrate. Accordingly, it was confirmed that graphene formed on the hexagonal boron nitride multilayer had excellent properties.

Figure 15A:
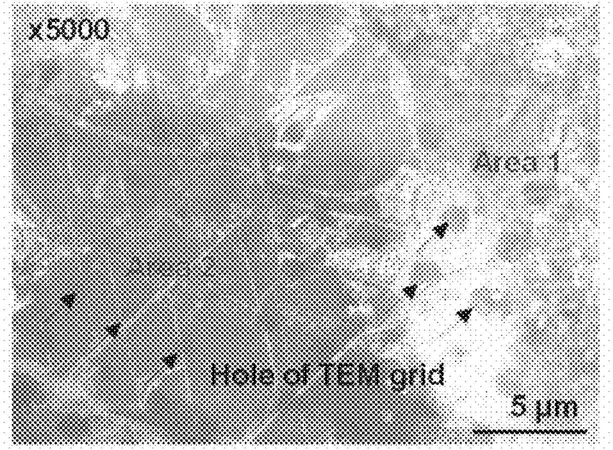
FIGS. 15A, 15B, 15C, and 15D are views for describing characteristics of $MoS_2$ formed on a hexagonal boron nitride multilayer.
Figure 15B:
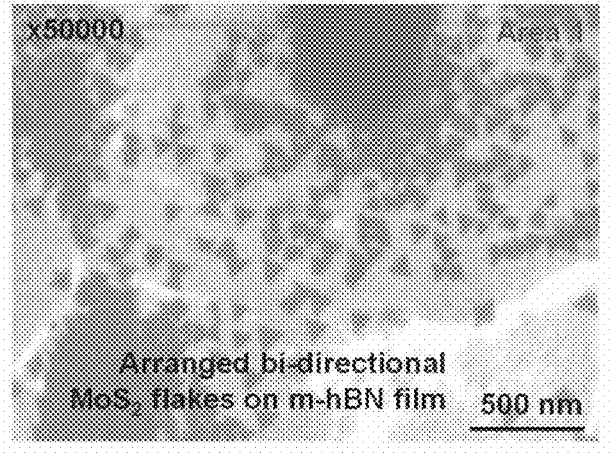
Figure 15C:
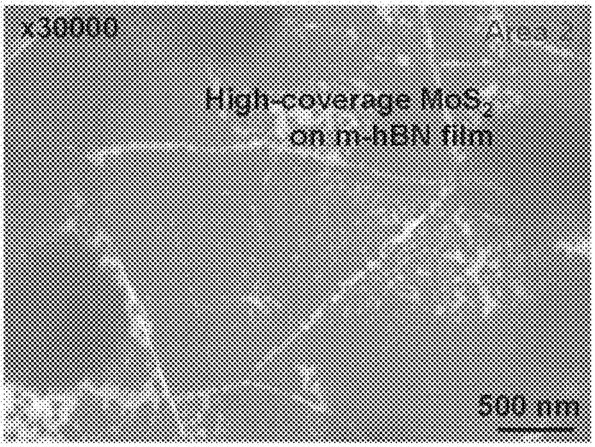
Figure 15D:
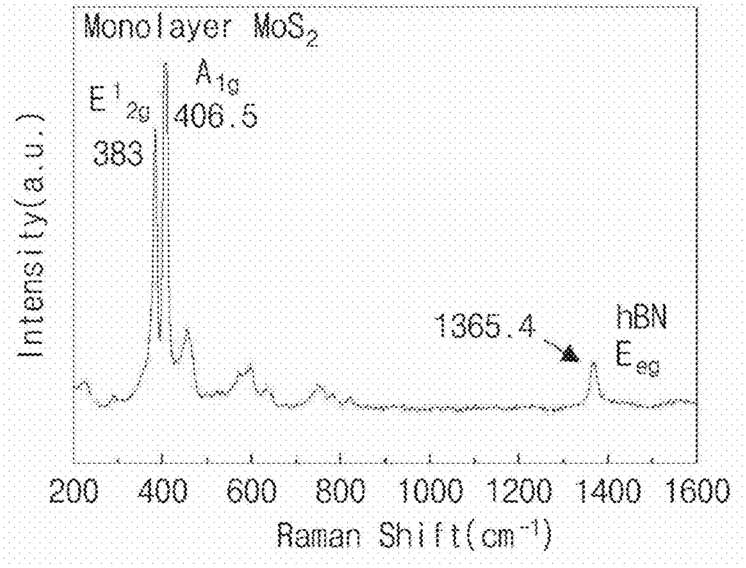

FIGS. 15A, 15B, 15C, and 15D are views for describing characteristics of $MoS_2$ formed on a hexagonal boron nitride multilayer. FIGS. 15A to 15D show results of performing the method of manufacturing a hexagonal boron nitride multilayer according to FIG. 2 in the deposition apparatus of FIG. 1, and then directly growing $MoS_2$ on the hexagonal boron nitride multilayer. FIG. 15A is an SEM image of a hexagonal boron nitride multilayer and $MoS_2$, FIG. 15B is an image enlarging region 1 of FIG. 15A, FIG. 15C is an image enlarging region 2 of FIG. 15A, and FIG. 15D is Raman spectrum of a hexagonal boron nitride multilayer and $MoS_2$.

Referring to FIGS. 15A, 15B, 15C, and 15D, it was confirmed that even when $MoS_2$ was directly grown on the hexagonal boron nitride multilayer, the direction of $MoS_2$ was not disordered and $MoS_2$ was grown bidirectionally. Accordingly, it was confirmed that $MoS_2$ was epitaxially grown on relatively large crystals of the boron nitride multilayer. In region 1, it was confirmed that $MoS_2$ was grown aligned in both directions. In region 2, it was confirmed that $MoS_2$ was grown with high coverage.

In embodiments of the inventive concept, a hexagonal boron nitride multilayer is manufactured using iron as a catalyst substrate at a process temperature of 1400° C. or higher, resulting in a hexagonal boron nitride multilayer having excellent crystallinity, uniformity, and coverage.

The above description on embodiments of the inventive concept of provides examples for describing the present disclosure.

Thus, the idea of the inventive concept is not limited to the above-described embodiments, and it would be clarified that various modifications and changes, for example, combinations of the above embodiments, could be made by those skilled in the art within the spirit of the inventive concept.

What is claimed is:

1. A method of manufacturing a hexagonal boron nitride multilayer, the method comprising:
- providing a catalyst substrate including iron into a tube;
- using a heater to raise an internal temperature of the tube to 1400° C. or higher; and
- providing a boron nitride precursor into the tube to form the hexagonal boron nitride multilayer on the catalyst substrate,
- wherein the providing of the boron nitride precursor into the tube comprises making the boron nitride precursor react with the catalyst substrate to dissolve boron in the catalyst substrate.

2. The method of claim 1, wherein the tube comprises aluminum oxide.

3. The method of claim 1, wherein the heater comprises silicon carbide or molybdenum silicide.

4. The method of claim 1, wherein the catalyst substrate in which boron is dissolved is melted forming a molten catalyst substrate.

5. The method of claim 4, further comprising lowering the internal temperature of the tube to solidify the molten catalyst substrate forming a solidified catalyst substrate.

6. The method of claim 5, wherein the solidified catalyst substrate comprises $Fe_2B$ crystals and Fe crystals.

7. The method of claim 1, wherein the boron nitride precursor is borazine.

8. A method of manufacturing a hexagonal boron nitride multilayer, the method comprising:
- providing a catalyst substrate including iron into a tube;
- using a heater to raise an internal temperature of the tube to 1400° C. or higher;
- providing a boron nitride precursor into the tube to melt the catalyst substrate forming a molten catalyst substrate; and
- lowering the internal temperature of the tube to solidify the molten catalyst substrate forming a solidified catalyst substrate.

9. The method of claim 8, wherein the melting of the catalyst substrate comprises melting the catalyst substrate entirely.

10. The method of claim 8, wherein the melting of the catalyst substrate comprises melting a portion of the catalyst substrate.

11. The method of claim 8, wherein the solidified catalyst substrate comprises $Fe_2B$ crystals and Fe crystals.

12. The method of claim 8, wherein the tube comprises aluminum oxide.

13. The method of claim 8, wherein the heater comprises silicon carbide or molybdenum silicide.

14. The method of claim 8, wherein the boron nitride precursor is borazine.

15. The method of claim 14, wherein the providing of the boron nitride precursor comprises providing the borazine from a bubbler system to the tube.

* * * * *